US010409500B2

(12) United States Patent
Trika et al.

(10) Patent No.: US 10,409,500 B2
(45) Date of Patent: Sep. 10, 2019

(54) MULTIPLE INDIRECTION GRANULARITIES FOR MASS STORAGE DEVICES

(71) Applicant: Intel Corporation, Santa Clara, CA (US)

(72) Inventors: Sanjeev N. Trika, Portland, OR (US); Peng Li, Hillsboro, OR (US); Jawad B. Khan, Portland, OR (US)

(73) Assignee: Intel Corporation, Santa Clara, CA (US)

(*) Notice: Subject to any disclaimer, the term of this patent is extended or adjusted under 35 U.S.C. 154(b) by 61 days.

(21) Appl. No.: 15/699,930

(22) Filed: Sep. 8, 2017

(65) Prior Publication Data
US 2019/0079681 A1 Mar. 14, 2019

(51) Int. Cl.
*G06F 3/06* (2006.01)
*H03M 13/29* (2006.01)
*G06F 11/10* (2006.01)
*G11C 29/52* (2006.01)
*G06F 12/1009* (2016.01)

(52) U.S. Cl.
CPC ............ *G06F 3/0616* (2013.01); *G06F 3/061* (2013.01); *G06F 3/0604* (2013.01); *G06F 3/0631* (2013.01); *G06F 3/0665* (2013.01); *G06F 3/0673* (2013.01); *G06F 11/1004* (2013.01); *G06F 11/1068* (2013.01); *G06F 12/1009* (2013.01); *G11C 29/52* (2013.01); *H03M 13/2906* (2013.01); *G06F 2212/1016* (2013.01); *G06F 2212/1036* (2013.01)

(58) Field of Classification Search
CPC ...... G06F 3/0616; G06F 3/0665; G06F 3/061; G06F 12/1009; G06F 3/0673; G06F 3/0631; G06F 3/0604; G06F 11/1068; G06F 11/1004; G06F 2212/1036; G06F 2212/1016; G11C 29/52; H03M 13/2906
See application file for complete search history.

(56) References Cited

U.S. PATENT DOCUMENTS 9,495,287 B2 * 11/2016 Griffin ................ G06F 12/1009
2008/0005530 A1 * 1/2008 Nakano ............... G06F 12/0246
711/207
2010/0042774 A1 * 2/2010 Yang .................... G06F 12/0246
711/103

(Continued)

*Primary Examiner* — Thien Nguyen
(74) *Attorney, Agent, or Firm* — Grossman, Tucker, Perreault & Pfleger, PLLC

(57) ABSTRACT

One embodiment provides a memory controller. The memory controller includes logical block address (LBA) section defining logic to define a plurality of LBA sections for a memory device circuitry, each section including a range of LBAs, and each section including a unique indirection-unit (IU) granularity; wherein the IU granularity defines a physical region size of the memory device. The LBA section defining logic also to generate a plurality of logical-to-physical (L2P) tables to map a plurality of LBAs to physical locations of the memory device, each L2P table corresponding to an LBA section. The memory controller also includes LBA section notification logic to notify a file system of the plurality of LBA sections to enable the file system to issue a read and/or write command having an LBA based on an IU granularity associated with an LBA section.

21 Claims, 6 Drawing Sheets

(56) References Cited

U.S. PATENT DOCUMENTS

| | | | |
|---|---|---|---|
| 2010/0274949 A1* | 10/2010 | Yeh | G06F 12/0246 |
| | | | 711/103 |
| 2015/0067245 A1* | 3/2015 | Kruger | G06F 3/0634 |
| | | | 711/103 |
| 2015/0309941 A1* | 10/2015 | Franceschini | G06F 12/10 |
| | | | 711/206 |
| 2016/0062885 A1* | 3/2016 | Ryu | G06F 12/0246 |
| | | | 711/103 |
| 2017/0083436 A1* | 3/2017 | Jung | G06F 12/0246 |
| 2017/0185354 A1* | 6/2017 | Doshi | G06F 3/0619 |
| 2017/0235681 A1* | 8/2017 | Kaburaki | G06F 12/0292 |
| | | | 711/128 |
| 2018/0189000 A1* | 7/2018 | Li | G06F 3/0608 |

\* cited by examiner

MULTIPLE INDIRECTION GRANULARITIES FOR MASS STORAGE DEVICES

FIELD

The present disclosure relates to time multiple indirection granularities for mass storage devices.

BACKGROUND

A typical NAND solid state drive (SSD) uses an indirection system, e.g., a logical-to-physical (L2P) table, to map user LBAs to physical NAND locations. The indirection unit (IU) granularity of the L2P is typically 4 KB, which may require 1 Gigabyte (GB) of dynamic random access memory (DRAM) per 1 Terabyte (TB) of SSD capacity. As NAND costs continue to decline while DRAM costs have remained stable or even increase, the DRAM becomes an increasingly greater fraction of the SSD cost. In addition, conventional file systems were designed to work on hard disk drives, which typically have a small (e.g., 512 Byte) sector size, and can do virtually an unlimited number or writes to those sectors without endurance concerns. For such devices, the file system typically issues a large number of writes to those sectors to update metadata as the files are accessed. For some common operating environments, these single sector writes may be +/–50% of the data writes. When applied to SSDs, this results in a very high read-modify-write (RMW) overhead, since typical IU granularity is 4 Kibibits (KiB) and may be increased to 64 KiB in the near future. This results in 8-128× performance and endurance overhead penalty for these +/–50% of the data writes. The negative impact is exacerbated by write-amplification introduced on an SSD due to the random-write nature of these small input/outputs (I/Os).

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Figure 1:
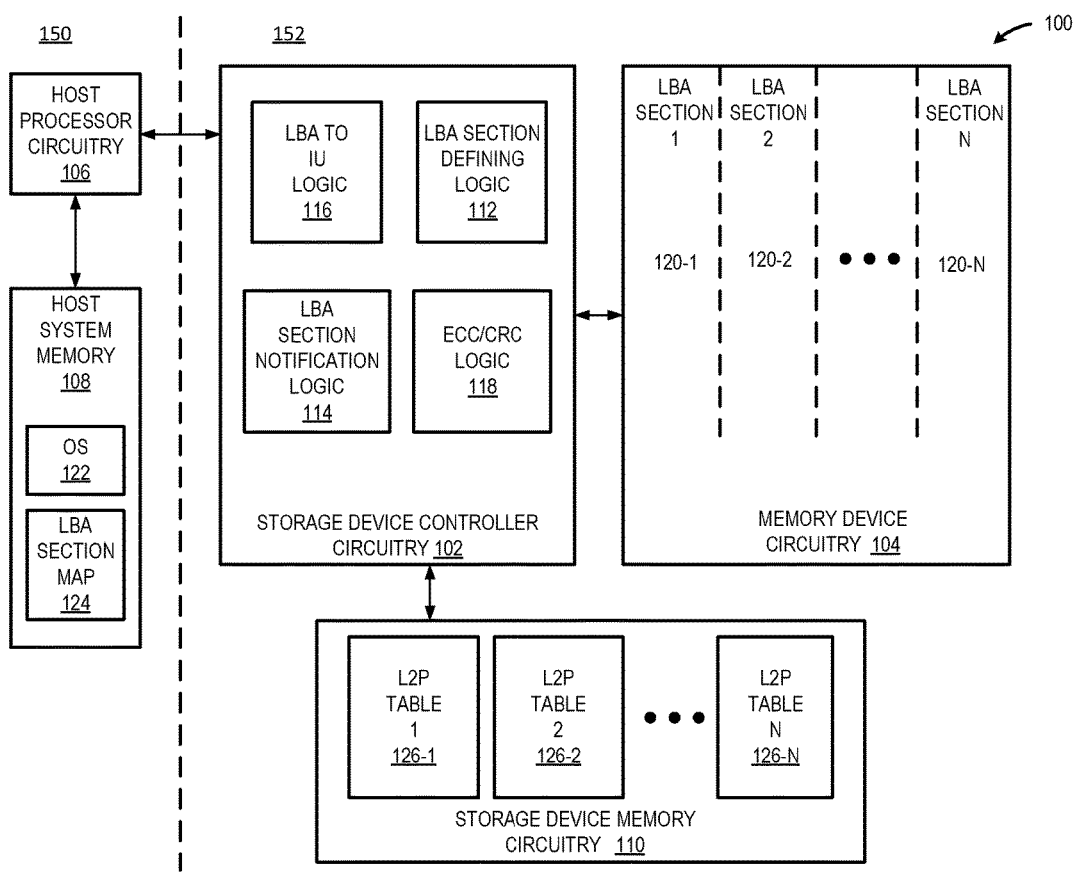
FIG. 1 illustrates a storage system consistent with several embodiments of the present disclosure.

FIG. 1 illustrates a system 100 consistent with several embodiments of the present disclosure. System 100 may include a storage device controller circuitry 102, memory device circuitry 104, host processor circuitry 106, host system memory 108, and storage device memory circuitry 110. Host system memory 108 and storage device memory circuitry 110 may include volatile random-access memory, e.g., dynamic random access memory (DRAM), static random access memory (SRAM), etc. In some embodiments, storage device memory circuitry 110 may be formed part of, and package with, memory device circuitry 104 and memory controller circuitry 102 as one integrated unit. Host processor circuitry 106 may correspond to a single core or a multi-core general purpose processor, such as those provided by Intel® Corp., etc. Host processor circuitry 106 and hosts system memory 108 may be collectively referred to herein as "host domain 150". Storage device controller circuitry 102, memory device circuitry 104 and storage device memory circuitry 110 may be collectively referred to herein as "storage domain 152".

Memory device circuitry 104 may include non-volatile memory (NVM) circuitry, e.g., a storage medium that does not require power to maintain the state of data stored by the storage medium. Nonvolatile memory may include, but is not limited to, a NAND flash memory (e.g., a Triple Level Cell (TLC) NAND or any other type of NAND (e.g., Single Level Cell (SLC), Multi Level Cell (MLC), Quad Level Cell (QLC), etc.)), NOR memory, solid state memory (e.g., planar or three Dimensional (3D) NAND flash memory or NOR flash memory), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), byte addressable random accessible 3D crosspoint memory, ferroelectric transistor random access memory (Fe-TRAM), magnetoresistive random access memory (MRAM), phase change memory (PCM, PRAM), resistive memory, ferroelectric memory (F-RAM, FeRAM), spin-transfer torque memory (STT), thermal assisted switching memory (TAS), millipede memory, floating junction gate memory (FJG RAM), magnetic tunnel junction (MTJ) memory, electrochemical cells (ECM) memory, binary oxide filament cell memory, interfacial switching memory, battery-backed RAM, ovonic memory, nanowire memory, electrically erasable programmable read-only memory (EEPROM), etc. In some embodiments, the byte addressable random accessible 3D crosspoint memory may include a transistor-less stackable cross point architecture in which memory cells sit at the intersection of words lines and bit lines and are individually addressable and in which bit storage is based on a change in bulk resistance.

Host system memory 108 may host an operating system (OS) 122 and, as will be described in greater detail below, and LBA section map 124. As a general matter, as an application (not shown) is executed by host processor circuitry 106, read and/or write operations targeting the memory device circuitry 104 may be issued by a file system associated with the OS 122. Such read and write operations generally include a logical block address (LBA) having an associated LBA sector size to be read from memory device circuitry 104 and/or written to memory device circuitry 104. In some embodiments, the LBA sector size may be a single, fixed size, e.g. 512 Bytes, and in other embodiments (as will be described below), the LBA sector size may be different for different applications/usage models.

Storage device controller circuitry 102 (hereafter "controller 102") is generally configured to control read and write operations between host processor circuitry 106 and memory device circuitry 104. To execute a read or write command, the controller 102 is generally configured to address physical blocks of the memory device circuitry 104 using an LBA issued from the host processor circuitry 106. However, since the LBA does not specify a physical address of the memory device circuitry 104, the controller 102 uses an indirection system to determine a physical address from an LBA. In the conventional file system, the indirection system uses a single logical-to-physical (L2P) table to map an LBA to a physical region (e.g., one or more sectors) of the memory device circuitry 104. In the conventional system, the granularity of the physical region mapped in an L2P table, also referred to herein as "IU sector size" or "IU granularity", is a single, fixed number that is generally on the order of the LBA sector size. In contrast, the present disclosure provides a plurality of L2P tables, where each table has a unique IU granularity. Thus, certain read/write operations may more efficiently utilize a smaller IU granularity, while other read/write operations may more efficiently utilize a larger IU granularity. As a general matter, a smaller IU granularity may require larger storage requirements for the corresponding L2P table and reduced write amplification for smaller write operations, while a larger IU granularity may require reduced storage requirements for the corresponding IU table and increased write amplification for smaller write operations.

Accordingly, controller 102 includes LBA section defining logic 112 generally configured to define two or more LBA sections of memory device circuitry 104, and each LBA section having a different IU sector size (granularity). The size of each LBA section may be based on, for example, operating environments, memory requirements/limitations, etc. The size of each unique IU granularity may be based on, for example, anticipated and/or given file conditions of applications, file/data types, etc. Thus, for example, in a given operating environment, LBS section defining logic 112 may define a first LBA section (Section 1) having an IU granularity of 512 bytes for smaller read/write operations and a second LBA section (Section 2) having an IU granularity of 64 Kibibytes for larger read/write operations. LBA section defining logic 112 is also configured to generate a plurality of L2P tables, L2P Table 1 (126-1), L2P Table 2 (126-2), . . . , L2P Table N (1262-N), based on the number of defined LBA sections (where N is a whole number greater than or equal to 1). The L2P tables 126-1, 126-2, . . . , 126-N may be stored in storage device memory circuitry 110. The LBA section defining logic 112 may define the L2P tables 126-1, 126-2, . . . , 126-N, for example, at system initialization, initialization of memory device circuitry 104, etc., and the IU granularity and LBA range for each LBA section may be user-programmable, predefined, etc. Each L2P table 126-1, 126-2, . . . , 126-N maps a range of IU index numbers to corresponding physical regions of the memory device circuitry 104, where each corresponding physical region has a size of the IU granularity defined for that LBA section. Thus, for example, L2P Table 1 may define an IU index range between 0-100 (integer based) and having an IU granularity of 4 KibiBytes, where each IU index number points to 4 Kibibytes of physical sector(s) of the memory device circuitry 104, etc. Each IU index number is determined from an LBA, as described below.

Depending on the number of LBA sections defined, the memory device circuitry device circuitry 104 may be logically divided into a plurality of LBA sections 120-1, 120-2, . . . , 120-N. In some embodiments, the number of LBA sections is 2. Each LBA section 120-1, 120-2, . . . , 120-N corresponds to a defined LBA range, for example, LBA section 1 corresponds to LBA range 0-(L-1), LBA section 2 corresponds to LBA range L-(M-1), . . . , LBA section N corresponds to LBA range M-N, etc. Where L, M and N are whole numbers greater than or equal to 1, and L<M<N. Each LBA section may correspond to a unique IU sector size (granularity). For example, LBA Section 1 (120-1) may have an IU granularity of 512 Bytes, LBA Section 2 (120-2) may have and IU granularity of 64 Kibibytes, etc. Of course, these are only example IU granularity sizes, and other embodiments granularity sizes are fully contemplated herein. As a general matter, an LBA sector size is typically smaller than an IU sector size (granularity).

To enable the host processor circuitry 106 to issue read and write commands that take advantage of multiple IU granularities, controller 102 may also include LBA section notification logic 114 configured to notify the OS 122 (and associated file system) of the LBA sections defined by the L2P tables 126-1, 126-2, . . . , 126-N and to generate an LBA section map 124. The LBA section map 124 generally defines a plurality of LBA ranges, and each LBA range corresponding to a unique IU granularity. As an example, assume two defined LBA sections where the IU granularity of Section 1 is less than the IU granularity of Section 2, and the LBA sector size is equal to or less than the IU granularity of Section 1. In operation, when the OS 122 is generating a read or write command, the OS 122 compares the size of a data payload/request of the read or write command to the LBA section map 124. If the data payload/request size is less than or equal to the IU granularity of Section 1, then the OS 122 issues the read or write command having an LBA corresponding to a number within the range of LBAs defined for Section 1. Otherwise, the OS 122 issues the read or write command having an LBA corresponding to a number within the range of LBAs defined for Section 2.

As noted above, the L2P tables 126-1, 126-2, . . . , 126-N utilize an IU index number to point to a physical region of the memory device circuitry device circuitry 104 (where the size of the physical region is the IU granularity). Also, as noted above, an LBA (issued by the host processor 106) does not directly point to a physical location of the memory device circuitry 104. Accordingly, controller 102 may also include LBA to IU logic 116 generally configured to determine an IU index number from an LBA. In some embodiments, to determine an IU index number, LBA to IU logic 116 is configured to determine which IU granularity corresponds to the issued LBA and to determine which L2P table, from among the plurality of L2P tables 126-1, 126-2, . . . , 126-N, to use to determine the physical location of the memory device circuitry 104 for the read/write command associated with the issued LBA. LBA to IU logic 116 is also configured to divide the IU granularity by the LBA sector size to determine the number of LBAs are associated with each IU sector size. LBA to IU logic 116 is also configured to divide the LBA by the number of LBAs associated with each IU sector size. This may generate a whole number, and may also generate a remainder. The whole number is the IU index number, and the remainder may be used as an offset within the IU granularity. Using the IU index number, the appropriate L2P table 126-1, 126-2, . . . , 126-N may be queried to determine the physical location on memory device circuitry 104 using the IU index number and any offset to determine the exact physical location of the read or write command associated with the issued LBA.

Controller 102 may also include error correction code (ECC)/cyclic redundancy code (CRC) logic 118. ECC/CRC logic 118 is configured to provide error checking functionality for controller 102. For example, ECC/CRC logic 118 may be configured to attach parity information, e.g., an ECC, to data being stored (i.e., during write operations) in memory device circuitry 104. In response to and/or as part of a read operation, the ECC/CRC logic 118 may be further configured to determine parity checks (i.e., error syndromes) that may then be utilized to detect errors, identify the bits with errors and/or correct data read from memory device circuitry 104. One or more techniques may be used for error correction and/or detection, e.g., Hamming codes, Reed-Solomon codes, Low Density Parity Check Codes (LDPCs), Bose-Chaudhuri-Hocquenghem (BCH) codes, etc. Of course, the listed error correction codes are merely examples and other ECCs configured to detect memory cell errors, to identify the error cells and/or to correct a number of detected errors may be utilized consistent with the present disclosure. ECC/CRC logic 118 may detect more errors than can be corrected by ECC/CRC logic 118. If ECC/CRC logic 118 detects more errors than can be corrected and/or the associated bits identified, the ECC/CRC logic 118 may be configured to notify host processor circuitry 106 of a memory read failure (i.e., fatal error). In the context of the present disclosure, the ECC/CRC logic 118 may be applied to read and write operations for each LBA section 120-1, 120-2, . . . , 120-N, and thus, since each LBA section may be associated with a unique IU granularity, ECC/CRC logic 118 may be configured to select an error correction scheme that is appropriately sized based on the IU granularity.

As an illustrative example write operation, assume that LBA Section 1 is defined with an IU granularity of 2 KibiBytes and the IU index range for Section 1 is 0-99. L2P Table 1 (126-1) therefore includes each of these integer indexes from 0-99, and each index points to a corresponding physical 2 Kibibyte region of the memory device circuitry 104. Also, assume that LBA Section 2 is defined with an IU granularity of 8 Kibibytes and the IU index range 100-999,999. L2P Table 2 (126-2) therefore includes each of these integer indexes from 100-999,999 and each index points to a corresponding physical 8 Kibibyte region of the memory device circuitry 104. Assume a fixed LBA size of 512 Bytes. Accordingly, for LBA Section 1, there are 4 LBAs for each IU granularity, and thus LBA Section 1 includes LBAs 0-399. Likewise, for LBA Section 2, there are 16 LBAs for each IU granularity, and thus LBA Section 2 includes LBAs 400—15,998,799. Accordingly, LBA section map 124 is defined to map the LBA numbers and IU granularity for each LBA section. In operation, the OS 122 may determine a write command has a data payload of 512 Bytes. The OS 122 may query the LBA section map 124 to determine the appropriate LBA section, in this case LBA Section 1 since the data payload is less than or equal to the IU granularity (2 KB) for LBA Section 1, and the OS may issue a write command using an LBA 0-99. Assume that OS 122 issues the write command using LBA 42. LBA to IU logic 116 receives the write command for LBA 42, and determines that the IU index number for L2P Table 1 (126-1) is 10 (42/4) with a remainder of 2. IU index 10 (in L2P Table 1) points to a corresponding 2 Kibibyte region of the memory device circuitry 104. The remainder of 2 means an offset of 2 LBA sector size units, in this case, 1 KiB (512 Bytes×2). Therefore, controller 102 performs a write operation starting at 1 KiB into the 2 KiB region identified by IU index 10.

The memory device circuitry 104 may have a page size determined by the IU sector size, and during a write operation the entire page is written to a clean page. In the above example, IU index 10 includes LBA 40-43. Therefore, during the write operation for LBA 42, the entire IU sector size containing LBA 40-43 is read from memory device circuitry 104, the 512 Byte sector of LBA 42 is modified (as described above), and the IU sector that defines LBA 40-43 are written to a new physical sector (page) on memory device circuitry 104. Thus, once the write operation is completed, controller 102 may also be configured to update the L2P table (in this example, L2P Table 1) so that IU index 10 points to the new physical location on memory device circuitry 104. Accordingly, with the multiple IU granularity as described herein, a smaller IU granularity may be defined for certain (smaller) data types and/or operations, which may reduce or eliminate large page read-modify-write operations.

Figure 2:
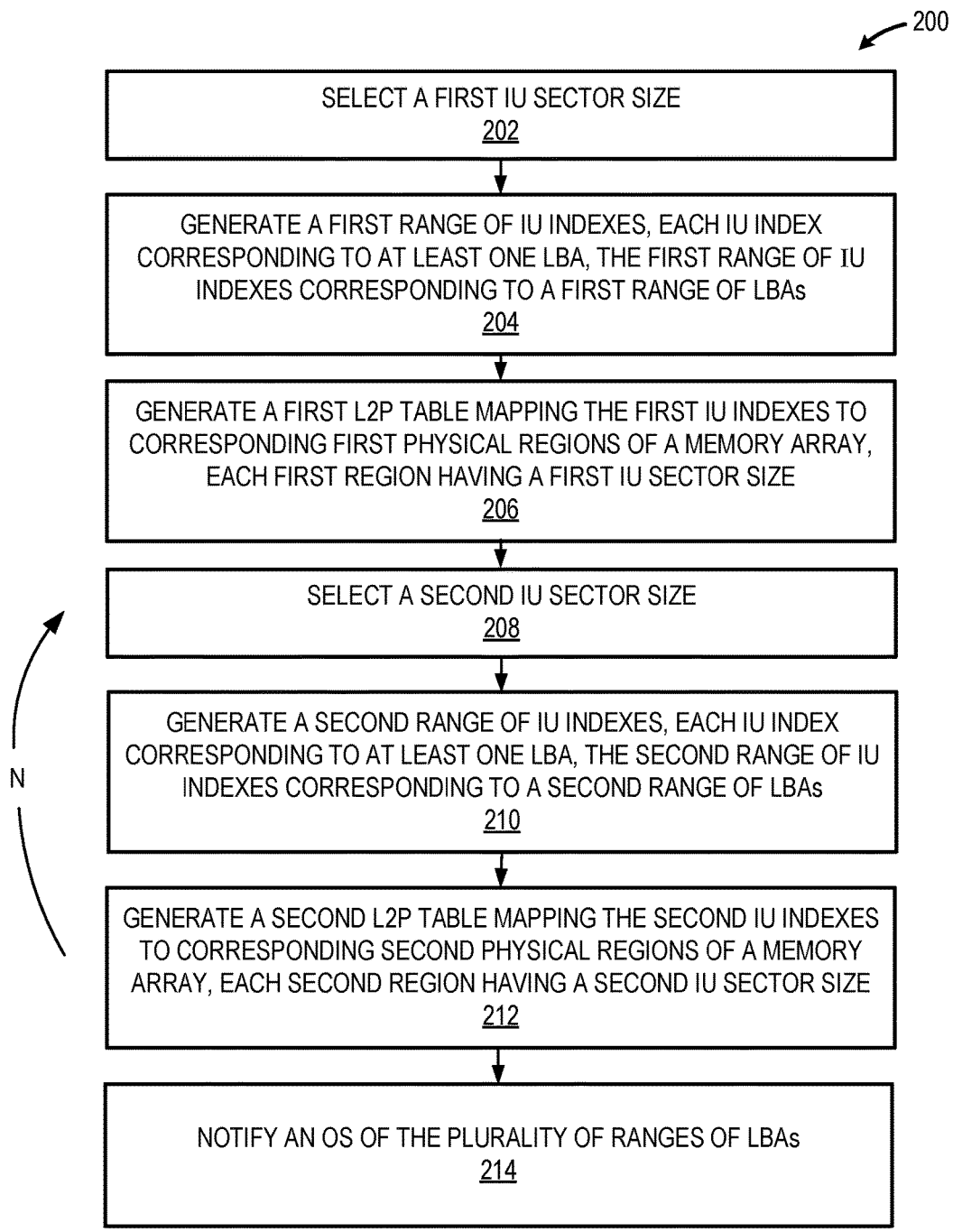
FIG. 2 is a flowchart illustrating operations consistent with various embodiments of the present disclosure.

FIG. 2 is a flowchart 200 of operations according to various embodiments of the present disclosure. In particular, the flowchart 200 illustrates a storage domain generating a multiple IU granularity storage environment, and notification of an operating system (file system) of the existence of multiple IU granularities. Operations of this embodiment may include selecting a first IU sector size (granularity) 202. As described above, the first IU sector size may be selected (e.g., user programmable and/or predefined) based on a particular operating environment, anticipated file/data structures of a given size, etc. Operations of this embodiment may also include generating a first range of IU indexes, where each IU index corresponds to at least one LBA issued by a host processor, and the first range of IU indexes corresponds to a first range of LBAs 204. This operation enables, for example, control over how large of a portion of a memory device circuitry is designated for the first IU granularity. Thus, for example, in an environment having a large number of file system metadata read/write operations, the first granularity may be on the order of an LBA sector size and the first range of IU indexes (and thus, LBAs) may be a significant portion of the overall size of the memory device circuitry. Operations of this embodiment may also include generating a first L2P table mapping the first IU indexes to corresponding first physical regions of a memory device circuitry, and each first region having a first IU sector size 206.

Operations of this embodiment may also include selecting a second IU sector size (granularity) 208. Operations may also include generating a second range of IU indexes, where each IU index of the second range of IU indexes corresponds to at least one LBA issued by a host processor or host processor circuitry, and the second range of IU indexes corresponds to a second range of LBAs 210. This operation enables, for example, control over how large of a portion of a memory device circuitry is designated for the second IU granularity. Thus, for example, in an environment having a large number of large data type files (e.g., user/application/OS files) for read/write operations, the second granularity may be much larger than an LBA sector size and the second range of IU indexes (and thus, second range of LBAs) may be a significant portion of the overall size of the memory device circuitry. Operations of this embodiment may also include generating a second L2P table mapping the second IU indexes to corresponding second physical regions of a memory device circuitry, and each second region having a second IU sector size 212. Of course, the present disclosure is not limited to only two LBA ranges and two IU granularities, and thus, for some operating environments these operations (208-212) may be repeated for N number of IU granularities and N number of LBA ranges. To enable an OS (file system) to determine an efficient LBA for a given read/write command, operations of this embodiment and includes notification of an OS of the plurality of ranges of LBAs 214.

Figure 3:
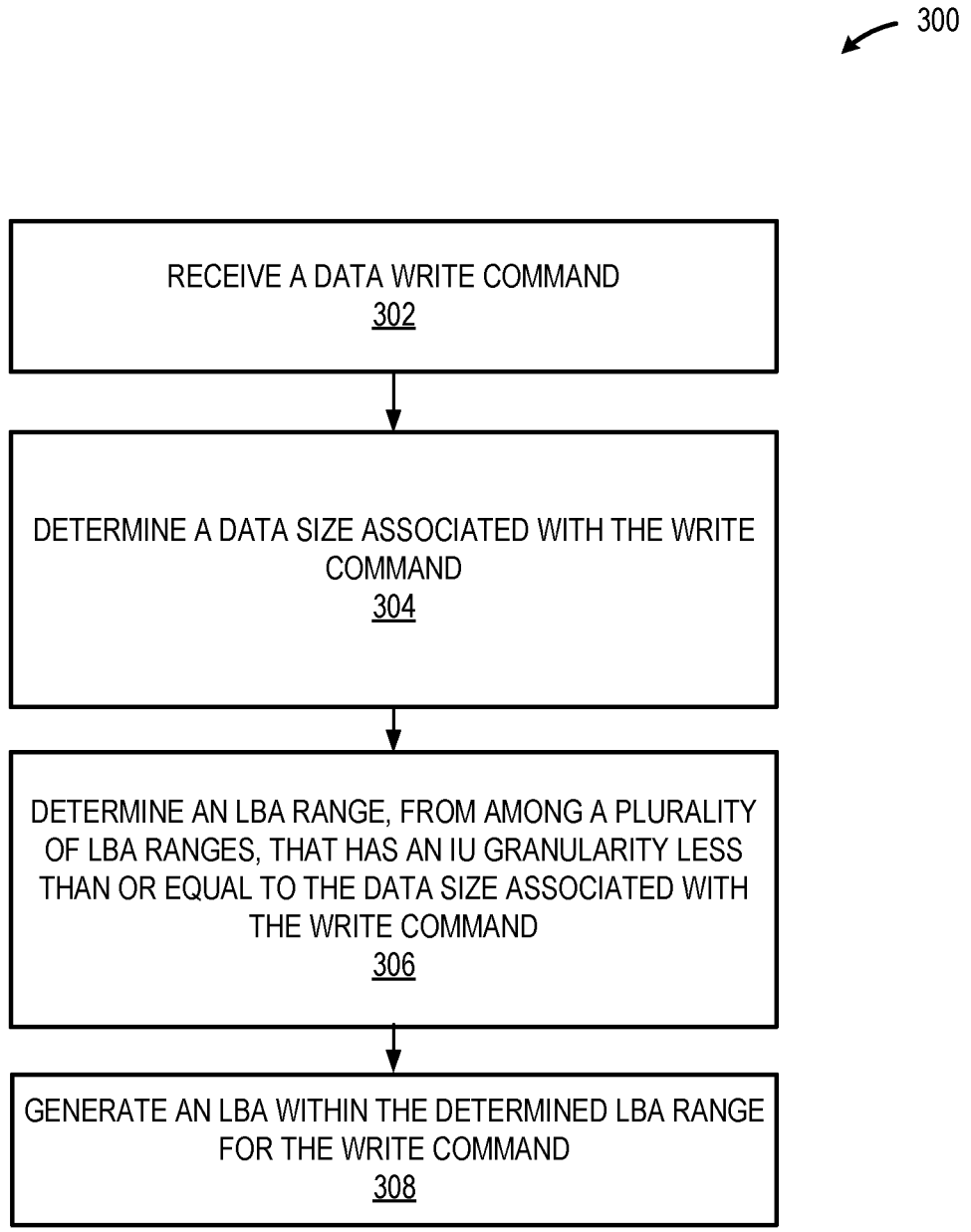
FIG. 3 is a flowchart illustrating operations of an operation system and/or file system for selecting an LBA based on a plurality of IU granularities, according to one embodiment of the present disclosure.

FIG. 3 is a flowchart 300 illustrating write operations of a host domain selecting an LBA based on a plurality of IU granularities, according to one embodiment of the present disclosure. Operations according to this embodiment include receiving, from an application or other process operating on a host domain, a data write command 302. Operations may also include determining a data size associated with the write command 304. Operations may also include determining an LBA range, from among a plurality of ranges of LBAs, that has an IU granularity less than or equal to the data size associated with the write command 306. Operations may also include generating an LBA within the determined LBA range for the write command 308. During read operations, the host domain may generate an LBA which is passed to the storage domain to retrieve data associated with the read command.

Figure 4:
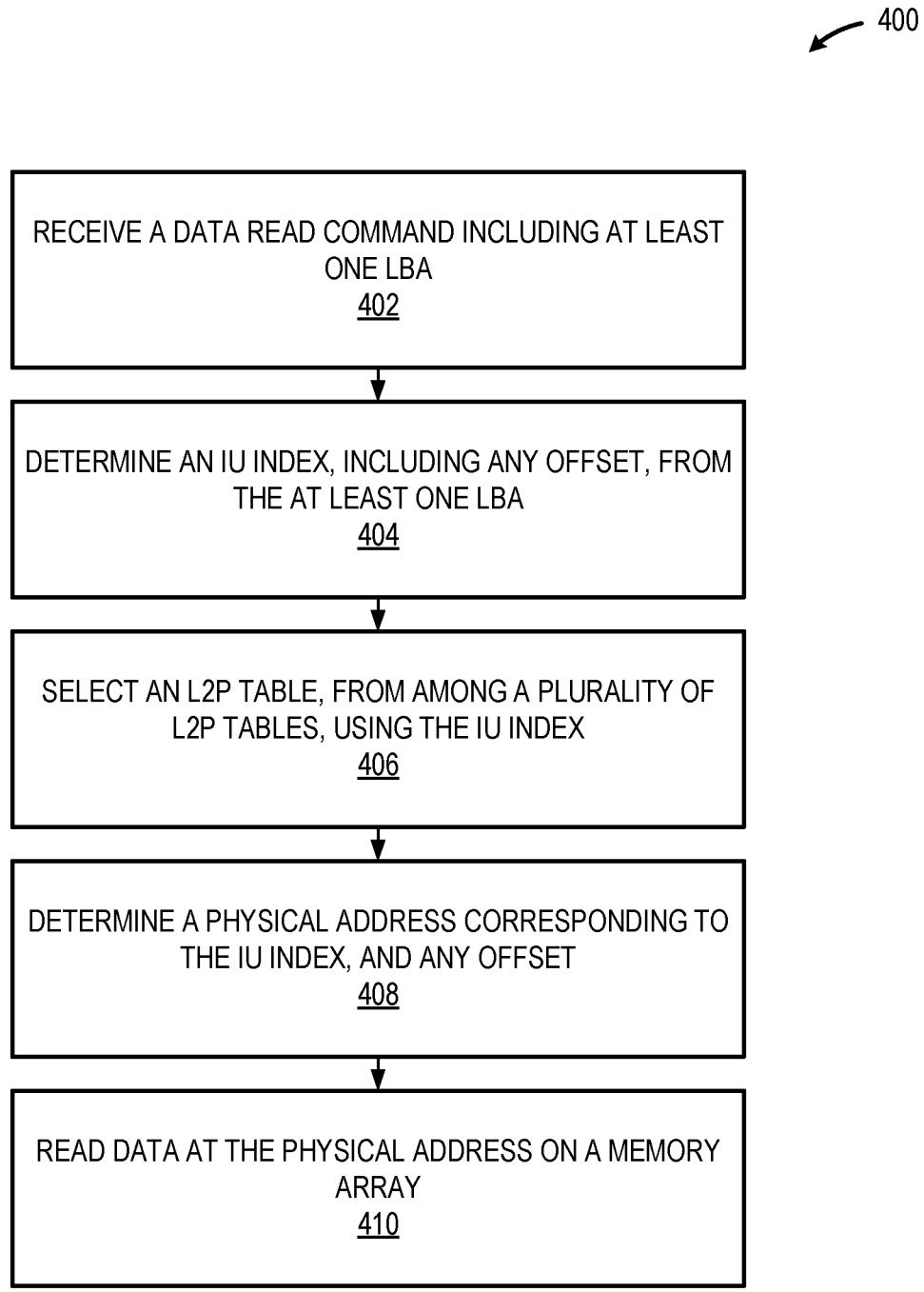
FIG. 4 is a flowchart illustrating data read operations of a memory controller in a multiple IU granularity environment, according to one embodiment of the present disclosure.

FIG. 4 is a flowchart 400 illustrating data read operations of a memory controller in a multiple IU granularity environment, according to one embodiment of the present disclosure. Operations of this embodiment may include receiving, from an OS and/or file system, a data read command including at least one LBA 402. Operations may also include determining an IU index, including any offset, from the at least one LBA 404. The IU index may be determined by determining the number of LBAs in a given IU sector size, and dividing the LBA issued by the host by the number of LBAs in the given IU sector size; where the whole number result is the IU index and the remainder is the offset (where each whole number increment of the remainder represents an LBA sector size unit unit). Operations may also include selecting an L2P table, from among a plurality of L2P tables, using the IU index 406. Operations may also include determining, using the selected L2P table, a physical address corresponding to the IU index, and any offset 408. Operations may also include reading data at the determined physical address (as may be shifted by any offset) on a memory device circuitry 410.

Figure 5:
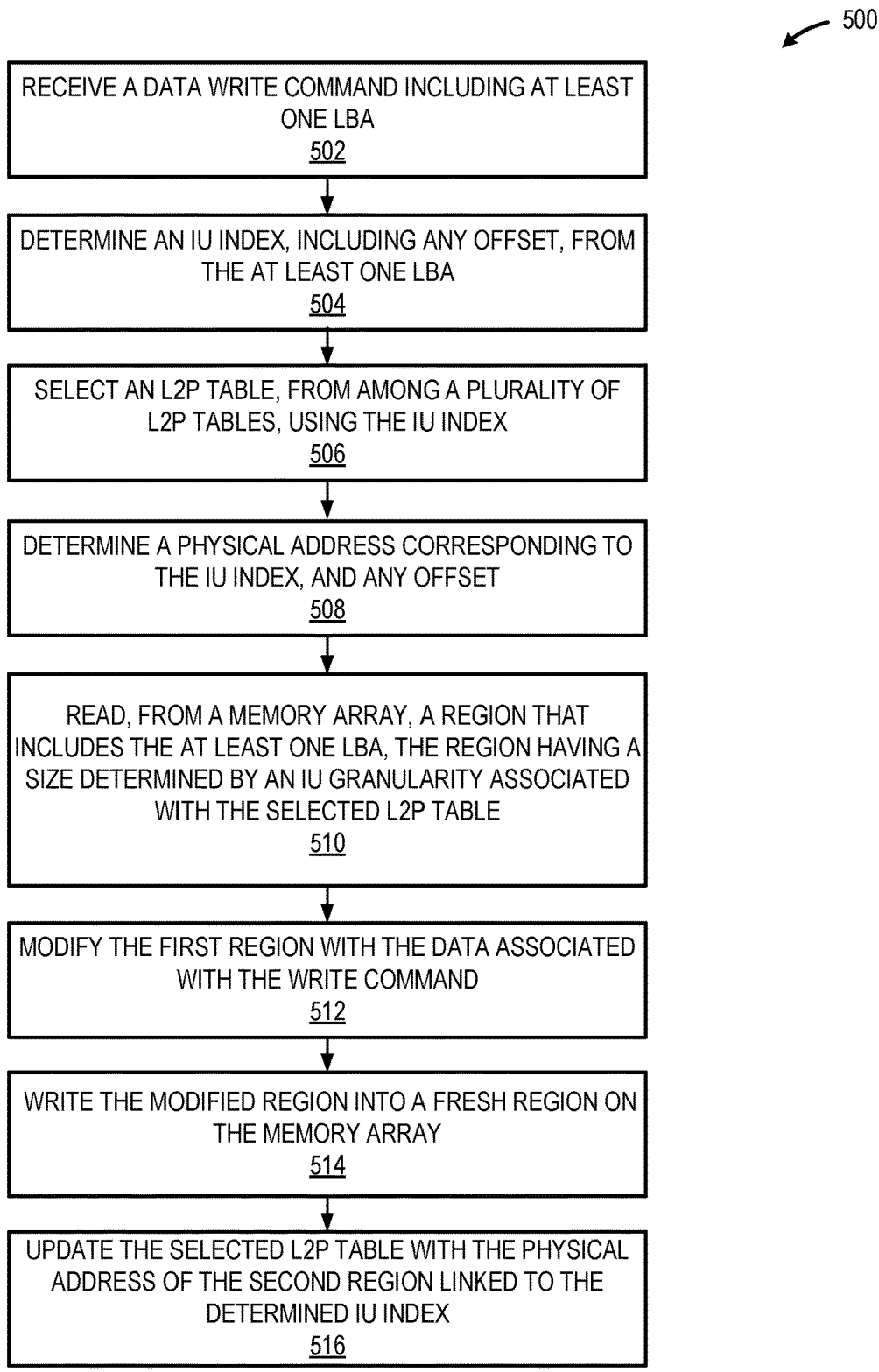
FIG. 5 is a flowchart illustrating data write operations of a memory controller in a multiple IU granularity environment, according to one embodiment of the present disclosure.

FIG. 5 is a flowchart 500 illustrating data write operations of a memory controller in a multiple IU granularity environment, according to one embodiment of the present disclosure. Operations of this embodiment may include receiving, from an OS and/or file system, a data write command including a data payload and at least one LBA 502. Operations may also include determining an IU index, including any offset, from the at least one LBA 504. The IU index may be determined by determining the number of LBAs in a given IU sector size, and dividing the LBA issued by the host by the number of LBAs in the given IU sector size; where the whole number result is the IU index and the remainder is the offset (where each whole number of the remainder represents an LBA sector size unit unit). Operations may also include selecting an L2P table, from among a plurality of L2P tables, using the IU index 506. Operations may also include determining, using the selected L2P table, a physical address corresponding to the IU index, and any offset 508. Operations may also include reading, from a memory device circuitry, a region that includes the at least one LBA, the region having a size determined by an IU granularity associated with the selected L2P table 510. Operations may also include modifying the read region with the data payload associated with the write command, starting at the physical address plus any offset 512. Operations may also include writing the modified region into a fresh region of the memory device circuitry 514. Operations may also include updating the selected L2P table with the physical address of the fresh region, and linking the physical address of the fresh region to the determined IU index 516.

Figure 6:
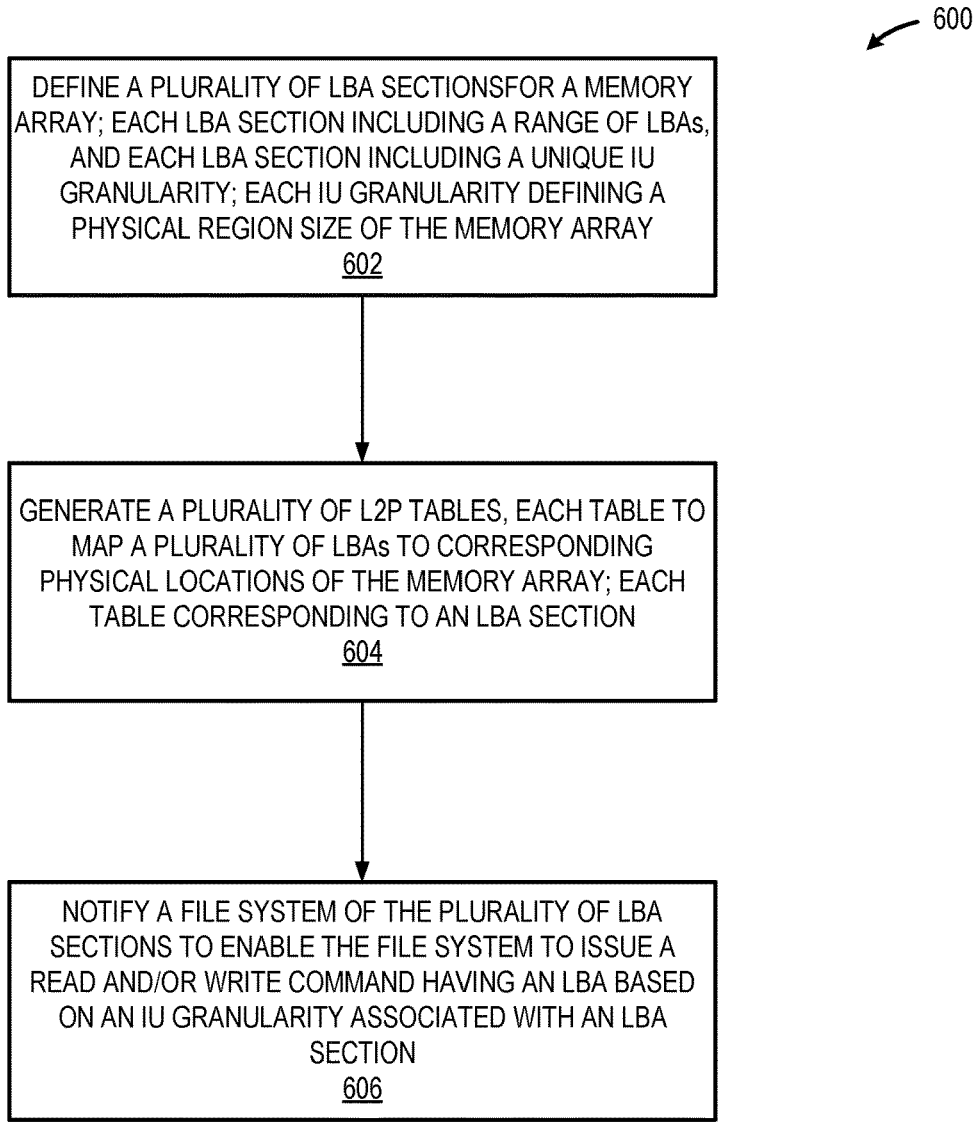
FIG. 6 is a flowchart illustrating operations consistent with various embodiments of the present disclosure.

FIG. 6 is a flowchart 600 illustrating operations consistent with various embodiments of the present disclosure. Operations according to these various embodiments include defining a plurality of LBA sections for a memory device circuitry 602. Each LBA section including a range of LBAs, and each section including a unique IU granularity. Each IU granularity defining a physical region size of the memory device circuitry. Operations may also include generating a plurality of logical-to-physical (L2P) tables to map a plurality of LBAs to corresponding physical locations of the memory device circuitry, each L2P table corresponding to an LBA section 604. Operations may also include notifying a file system of the plurality of LBA sections to enable the file system to issue a read and/or write command having an LBA based on an IU granularity associated with an LBA section 606.

While the flowcharts of FIGS. 2-6 illustrate operations according various embodiments, it is to be understood that not all of the operations depicted in FIGS. 2-6 are necessary for other embodiments. In addition, it is fully contemplated herein that in other embodiments of the present disclosure, the operations depicted in FIGS. 2, 3, 4, 5 and/or 6 and/or other operations described herein may be combined in a manner not specifically shown in any of the drawings, and such embodiments may include less or more operations than are illustrated in FIGS. 2, 3, 4, 5 and/or 6. Thus, claims directed to features and/or operations that are not exactly shown in one drawing are deemed within the scope and content of the present disclosure.

While the foregoing embodiments describe a fixed LBA size, in the embodiments, the file system/OS may enable multiple LBA sizes. In such embodiments, one or more LBA sector sizes may be selected to match or closely match a given IU granularity.

Advantageously, the present disclosure provides a multiple indirection unit granularity storage system that enables the use of multiple granularity sizes to accommodate small and large file read and write operations. Advantageously, reducing the IU granularity size for certain read/write operations and data sizes may increase efficiency by reducing, for example, read-modify-write overhead for small single-sector write operations, but may increase overall storage space required for an L2P table with a "small" IU granularity. Also advantageously, increasing the IU granularity for other read/write operations and data sizes may decrease overhead and decrease overall storage space required for an L2P table with a "large" IU granularity. In addition, by providing multiple L2P tables (beyond only 2) and corresponding unique IU granularities, each system may be tailored to maximize efficiency of read/write operations and decrease total memory space to store the L2P tables. In still other embodiments, the teachings of the present disclosure may provide wear-leveling and/or space consolidation within the memory device circuitry 104 across LBA sections. For example, L2P tables with smaller IU granularities may include index entries that point to the same "band" and larger-IU L2P tables, and also include offset information within a page.

As used in any embodiment herein, the term "logic" may refer to an application, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hardwired circuitry, programmable circuitry, state machine circuitry, logic and/or firmware that stores instructions executed by programmable circuitry. The circuitry may be embodied as an integrated circuit, such as an integrated circuit chip, such as an application-specific integrated circuit (ASIC), etc. In some embodiments, the circuitry may be formed, at least in part, by a processor (e.g., host processor circuitry 106 and/or controller 102) executing code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip (SoC) architecture.

The foregoing provides example system architectures and methodologies, however, modifications to the present disclosure are possible. The processor may include one or more processor cores and may be configured to execute system software. System software may include, for example, an operating system. Device memory may include I/O memory buffers configured to store one or more data packets that are to be transmitted by, or received by, a network interface.

The operating system (OS) 122 may be configured to manage system resources and control tasks that are run on, e.g., system 100. For example, the OS may be implemented using Microsoft® Windows®, HP-UX®, Linux®, or UNIX®, although other operating systems may be used. In another example, the OS may be implemented using Android™, iOS, Windows Phone® or BlackBerry®. In some embodiments, the OS may be replaced by a virtual machine monitor (or hypervisor) which may provide a layer of abstraction for underlying hardware to various operating systems (virtual machines) running on one or more processing units. The operating system and/or virtual machine may implement a protocol stack. A protocol stack may execute one or more programs to process packets. An example of a protocol stack is a TCP/IP (Transport Control Protocol/Internet Protocol) protocol stack comprising one or more programs for handling (e.g., processing or generating) packets to transmit and/or receive over a network.

Memory 108, 110 may each include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog-Unified Hardware Design, Specification, and Verification Language, dated Jul. 7, 2011; IEEE Std 1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a method, means for performing acts of the method, a device, or of an apparatus or system related to a storage system with multiple indirection unit granularities, as discussed below.

Example 1

According to this example, there is provided a memory controller. The memory controller includes logical block address (LBA) section defining logic to define a plurality of LBA sections for a memory device, each section including a range of LBAs, and each section including a unique indirection-unit (IU) granularity; wherein the IU granularity defines a physical region size of the memory device; the LBA section defining logic also to generate a plurality of logical-to-physical (L2P) tables to map a plurality of LBAs to corresponding physical locations of the memory device, each L2P table corresponding to an LBA section; and LBA section notification logic to notify a file system of the plurality of LBA sections to enable the file system to issue a read and/or write command having an LBA based on an IU granularity associated with an LBA section.

Example 2

This example includes the elements of example 1, further including LBA to IU logic to determine an IU index number based on the LBA; and wherein each L2P table includes a range of IU index numbers corresponding to a range of LBAs; and wherein each IU index number points to a physical region of the memory device having region size of the IU granularity associated with the corresponding LBA section.

Example 3

This example includes the elements of example 2, wherein the LBA to IU logic to determine an IU index number by dividing an IU granularity by an LBA sector size to determine the number of LBA sectors in the IU granularity, and dividing the LBA by the by the number of LBA sectors in the IU granularity; wherein the whole number result is the IU index number and any remainder is an offset where each integer of the offset represent an LBA sector size.

Example 4

This example includes the elements of example 1, wherein the plurality of LBA sections include a first LBA section having an IU granularity size based on a first group of data sizes associated with the file system, and a second LBA section having an IU granularity size based on a second group of data sizes associated with the files system; wherein the first IU granularity is smaller than the second IU granularity.

Example 5

This example includes the elements of example 1, wherein an LBA is issued by the file system and the LBA is a fixed sector size.

Example 6

This example includes the elements of example 1, further comprising error correction code and cyclic redundancy code logic to provide error correction to read and write operations of the memory device; wherein the error correction code and cyclic redundancy code logic is based on an IU granularity.

Example 7

According to this example, there is provided a method. The method includes:
defining, by logical block address (LBA) section defining logic, a plurality of LBA sections for a memory device, each section including a range of LBAs, and each section including a unique indirection-unit (IU) granularity; wherein each IU granularity defines a physical region size of the memory device;
generating, logical block address (LBA) section defining logic, a plurality of logical-to-physical (L2P) tables to map a plurality of LBAs to corresponding physical locations of the memory device, each L2P table corresponding to an LBA section; and
notifying, by LBA section notification logic, a operating system of the plurality of LBA sections to enable the operating system to issue a read and/or write command having an LBA based on an IU granularity associated with each an LBA section.

Example 8

This example includes the elements of example 7, further including determining, by LBA to IU logic, an IU index number based on an LBA; and wherein each L2P table includes a range of IU index numbers corresponding to a range of LBAs; and wherein each IU index number points to a physical region of the memory device having region size of the IU granularity associated with the corresponding LBA section.

Example 9

This example includes the elements of example 8, wherein determining an IU index number includes dividing an IU granularity by an LBA sector size to determine the number of LBA sectors in the IU granularity, and dividing the LBA by the by the number of LBA sectors in the IU granularity; wherein the whole number result is the IU index number and any remainder is an offset where each integer of the offset represent an LBA sector size.

Example 10

This example includes the elements of example 7, wherein the plurality of LBA sections include a first LBA section having an IU granularity size based on a first group of data sizes associated with the file system, and a second LBA section having an IU granularity size based on a second group of data sizes associated with the files system; wherein the first IU granularity is smaller than the second IU granularity.

Example 11

This example includes the elements of example 7, wherein an LBA is issued by the file system and the LBA is a fixed sector size.

Example 12

According to this example, there is provided a computer readable storage device having stored thereon instructions that when executed by one or more processors result in the following operations including:
define, by logical block address (LBA) section defining logic, a plurality of LBA sections for a memory device, each section including a range of LBAs, and each section including a unique indirection-unit (IU) granularity; wherein each IU granularity defines a physical region size of the memory device;
generate, logical block address (LBA) section defining logic, a plurality of logical-to-physical (L2P) tables to map a plurality of LBAs to corresponding physical locations of the memory device, each L2P table corresponding to an LBA section; and
notify, by LBA section notification logic, an operating system of the plurality of LBA sections to enable the operating system to issue a read and/or write command having an LBA based on an IU granularity associated with each an LBA section.

Example 13

This example includes the elements of example 12, wherein the instructions that when executed by one or more processors result in the following operations including:
determine, by LBA to IU logic, an IU index number based on an LBA; and wherein each L2P table includes a range of IU index numbers corresponding to a range of LBAs; and wherein each IU index number points to a physical region of the memory device having region size of the IU granularity associated with the corresponding LBA section.

Example 14

This example includes the elements of example 13, wherein the instructions that when executed by one or more processors result in the following operations comprising:
divide an IU granularity by an LBA sector size to determine the number of LBA sectors in the IU granularity, and divide the LBA by the by the number of LBA sectors in the IU granularity; wherein the whole number result is the IU index number and any remainder is an offset where each integer of the offset represent an LBA sector size.

Example 15

This example includes the elements of example 12, wherein the plurality of LBA sections include a first LBA section having an IU granularity size based on a first group of data sizes associated with the file system, and a second LBA section having an IU granularity size based on a second group of data sizes associated with the files system; wherein the first IU granularity is smaller than the second IU granularity.

Example 16

This example includes the elements of example 12, wherein an LBA is issued by the file system and the LBA is a fixed sector size.

Example 17

According to this example, there is provided a multiple indirection unit storage system. The system includes:
processor circuitry;
a memory device; and
a memory controller comprising:
logical block address (LBA) section defining logic to define a plurality of LBA sections for a memory device, each section including a range of LBAs, and each section including a unique indirection-unit (IU) granularity; wherein the IU granularity defines a physical region size of the memory device; the LBA section defining logic also to generate a plurality of logical-to-physical (L2P) tables to map a plurality of LBAs to corresponding physical locations of the memory device, each L2P table corresponding to an LBA section; and
LBA section notification logic to notify a file system of the plurality of LBA sections to enable the file system to issue a read and/or write command having an LBA based on an IU granularity associated with an LBA section.

Example 18

This example includes the elements of example 17, the memory controller further includes LBA to IU logic to determine an IU index number based on the LBA; and wherein each L2P table includes a range of IU index numbers corresponding to a range of LBAs; and wherein each IU index number points to a physical region of the memory device having region size of the IU granularity associated with the corresponding LBA section.

Example 19

This example includes the elements of example 18, wherein the LBA to IU logic to determine an IU index number by dividing an IU granularity by an LBA sector size to determine the number of LBA sectors in the IU granularity, and dividing the LBA by the by the number of LBA sectors in the IU granularity; wherein the whole number result is the IU index number and any remainder is an offset where each integer of the offset represent an LBA sector size.

Example 20

This example includes the elements of example 17, wherein the plurality of LBA sections include a first LBA section having an IU granularity size based on a first group of data sizes associated with the file system, and a second LBA section having an IU granularity size based on a second group of data sizes associated with the files system; wherein the first IU granularity is smaller than the second IU granularity.

Example 21

This example includes the elements of example 17, further comprising a host system memory to host an application to be executed by the processor circuitry, wherein an LBA is issued by the application and the LBA is a fixed sector size.

Example 22

This example includes the elements of example 17, further comprising a host system memory to host an LBA section map having a map of LBA ranges to corresponding LBA sections.

Example 23

This example includes the elements of example 17, further comprising memory circuitry, associated with the memory device and memory controller, the memory circuitry to store the plurality of L2P tables.

Example 24

This example includes the elements of example 17, wherein the memory device is non-volatile memory circuitry.

Example 25

This example includes the elements of example 1, wherein the memory device is non-volatile memory circuitry.

Example 26

This example includes the elements of example 7, wherein the memory device is non-volatile memory circuitry.

Example 27

This example includes the elements of example 12, wherein the memory device is non-volatile memory circuitry.

Example 28

This example includes the elements of example 17, wherein a first unique IU granularity is 512 KB and a second unique IU granularity is 4 KB.

Example 29

This example includes the elements of example 1, wherein a first unique IU granularity is 512 KB and a second unique IU granularity is 4 KB.

Example 30

This example includes the elements of example 7, wherein a first unique IU granularity is 512 KB and a second unique IU granularity is 4 KB.

Example 31

This example includes the elements of example 12, wherein a first unique IU granularity is 512 KB and a second unique IU granularity is 4 KB.

Example 32

This example provides a host domain for a storage system. The host domain includes:
processor circuitry;
memory circuitry configured to store operating system logic and logical block address (LBA) section map logic; wherein the LBA section map logic defining a plurality of LBA sections of a storage device in communication with the host domain, and wherein each LBA section having a range of LBAs;
wherein the processor circuitry to execute an application and determine an LBA section, from among the plurality of LBA sections, based on a data size of a write command associated with the application.

Example 33

This example includes the elements of example 32, wherein each LBA section having a corresponding indirection unit (IU) granularity associated with the storage device.

Example 34

This example includes the elements of example 32, wherein the memory device is non-volatile memory circuitry.

Example 35

This example includes the elements of example 32, wherein a first unique IU granularity is 512 KB and a second unique IU granularity is 4 KB.

Example 36

This example provides a storage system. The storage system includes:
a storage domain comprising logical block address (LBA) section defining logic to define a plurality of LBA sections for a memory device, each section including a range of LBAs, and each section including a unique indirection-unit (IU) granularity; wherein the IU granularity defines a physical region size of the memory device; the LBA section defining logic also to generate a plurality of logical-to-physical (L2P) tables to map a plurality of LBAs to corresponding physical locations of the memory device, each L2P table corresponding to an LBA section; and LBA section notification logic to notify a file system of the plurality of LBA sections to enable the file system to issue a read and/or write command having an LBA based on an IU granularity associated with an LBA section.
a host domain to store operating system logic and logical block address (LBA) section map logic; wherein the LBA section map logic to map the LBA sections of the memory device and ranges of LBAs of each LBA section; wherein the host domain to execute an application and determine an LBA section, from among the plurality of LBA sections, based on a data size of a write command associated with the application.

Example 37

This example includes the elements of example 36, the storage domain further including LBA to IU logic to determine an IU index number based on the LBA; and wherein each L2P table includes a range of IU index numbers corresponding to a range of LBAs; and wherein each IU index number points to a physical region of the memory device having region size of the IU granularity associated with the corresponding LBA section.

Example 38

This example includes the elements of example 37, wherein the LBA to IU logic to determine an IU index number by dividing an IU granularity by an LBA sector size to determine the number of LBA sectors in the IU granularity, and dividing the LBA by the by the number of LBA sectors in the IU granularity; wherein the whole number result is the IU index number and any remainder is an offset where each integer of the offset represent an LBA sector size.

Example 39

This example includes the elements of example 36, wherein the plurality of LBA sections include a first LBA section having an IU granularity size based on a first group of data sizes associated with the file system, and a second LBA section having an IU granularity size based on a second group of data sizes associated with the files system; wherein the first IU granularity is smaller than the second IU granularity.

Example 40

This example includes the elements of example 36, wherein an LBA is issued by the host domain and the LBA is a fixed sector size.

Example 41

This example includes the elements of example 36, the storage domain further comprising error correction code and cyclic redundancy code logic to provide error correction to read and write operations of the memory device; wherein the error correction code and cyclic redundancy code logic is based on an IU granularity.

Example 42

This example provides a system including at least one device arranged to perform the method of any one of claims 7 to 11.

Example 43

This example provides a device including means to perform the method of any one of claims 7 to 11.

Example 44

This example provides a computer readable storage device having stored thereon instructions that when executed by one or more processors result in the following operations comprising: the method according to any one of claims 7 to 11.

Example 45

According to this example there is provided a multiple indirection unit storage system, comprising:
a memory device circuitry; and
a memory controller comprising:
logical block address (LBA) section defining logic to define a plurality of LBA sections for a memory device circuitry, each section including a range of LBAs, and each section including a unique indirection-unit (IU) granularity; wherein the IU granularity defines a physical region size of the memory device circuitry; the LBA section defining logic also to generate a plurality of logical-to-physical (L2P) tables to map a plurality of LBAs to corresponding physical locations of the memory device circuitry, each L2P table corresponding to an LBA section; and
LBA section notification logic to notify a file system of the plurality of LBA sections to enable the file system to issue a read and/or write command having an LBA based on an IU granularity associated with an LBA section.

Example 46

This example includes the elements of example 45, the memory controller further comprising LBA to IU logic to determine an IU index number based on the LBA; and wherein each L2P table includes a range of IU index numbers corresponding to a range of LBAs; and wherein each IU index number points to a physical region of the memory device having region size of the IU granularity associated with the corresponding LBA section.

Example 47

This example includes the elements of example 46, wherein the LBA to IU logic to determine an IU index number by dividing an IU granularity by an LBA sector size to determine the number of LBA sectors in the IU granularity, and dividing the LBA by the by the number of LBA sectors in the IU granularity; wherein the whole number result is the IU index number and any remainder is an offset where each integer of the offset represent an LBA sector size.

Example 48

This example includes the elements of example 45, wherein the plurality of LBA sections include a first LBA section having an IU granularity size based on a first group of data sizes associated with the file system, and a second LBA section having an IU granularity size based on a second group of data sizes associated with the files system; wherein the first IU granularity is smaller than the second IU granularity.

Example 49

This example includes the elements of example 45, further comprising memory circuitry, associated with the memory device circuitry and memory controller, the memory circuitry to store the plurality of L2P tables.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A memory controller, comprising:
logical block address (LBA) section-defining circuitry to:
define a plurality of LBA sections of memory device circuitry, wherein each defined LBA section includes multiple LBAs and has a unique indirection-unit (IU) granularity that defines a physical region size of the memory device circuitry associated with the defined LBA section; and
generate a plurality of logical-to-physical (L2P) tables to map a plurality of LBAs to physical locations of the memory device, each L2P table corresponding to one of the plurality of defined LBA sections; and
LBA section-notification circuitry to notify a file system of the defined plurality of LBA sections to enable the file system to issue a data access command indicating an LBA based at least in part on the unique IU granularity of a defined LBA section that includes the indicated LBA.

2. The memory controller of claim 1, further comprising LBA to IU logic to determine an IU index number based on the LBA; wherein each L2P table includes multiple IU index numbers, corresponding to a group of LBAs; and wherein each IU index number indicates a physical region of the memory device circuitry having a region size of the IU granularity associated with the corresponding LBA section.

3. The memory controller of claim 2, wherein the LBA to IU logic is further to determine an IU index number by dividing an IU granularity by an LBA sector size to determine a number of LBA sectors in the IU granularity, and dividing the LBA by the by the number of LBA sectors in the IU granularity; wherein a whole number result is the IU index number and any remainder is an offset where each integer of the offset represent an LBA sector size.

4. The memory controller of claim 1, wherein the plurality of LBA sections include a first LBA section having a first IU granularity size based on a first group of data sizes associated with the file system, and a second LBA section having a second IU granularity size based on a second group of data sizes associated with the files system; wherein the first IU granularity size is smaller than the second IU granularity size.

5. The memory controller of claim 1, wherein an LBA is issued by the file system and the LBA is a fixed sector size.

6. The memory controller of claim 1, further comprising error correction code and cyclic redundancy code logic to provide error correction to read and write operations of the memory device; wherein the error correction code and cyclic redundancy code logic is based on an IU granularity.

7. A method comprising:
defining, via section-defining circuitry, a plurality of LBA sections of memory device circuitry, each defined LBA section including multiple LBAs and having a unique indirection-unit (IU) granularity that defines a physical region size of the memory device circuitry associated with the defined LBA section;
generating, via the section-defining circuitry, a plurality of logical-to-physical (L2P) tables to map a plurality of LBAs to corresponding physical locations of the memory device, each L2P table corresponding to one of the plurality of defined LBA sections; and
notifying, via section-notification circuitry, an operating system of the defined plurality of LBA sections to enable the operating system to issue a data access command indicating an LBA based at least in part on the unique IU granularity of a defined LBA section that includes the indicated LBA.

8. The method of claim 7, further comprising determining an IU index number based on an LBA; wherein each L2P table includes multiple IU index numbers corresponding to a range of LBAs; and wherein each IU index number indicates a physical region of the memory device circuitry having a region size of the IU granularity associated with the corresponding LBA section.

9. The method of claim 8, wherein determining an IU index number includes dividing an IU granularity by an LBA sector size to determine a number of LBA sectors in the IU granularity, and dividing the LBA by the by the number of LBA sectors in the IU granularity; wherein a whole number result is the IU index number and any remainder is an offset where each integer of the offset represent an LBA sector size.

10. The method of claim 7, wherein the plurality of LBA sections include a first LBA section having a first IU granularity size based on a first group of data sizes associated with the file system, and a second LBA section having a second IU granularity size based on a second group of data sizes associated with the files system; wherein the first IU granularity size is smaller than the second IU granularity size.

11. The method of claim 7, wherein an LBA is issued by the operating system and the LBA is a fixed sector size.

12. A non-transitory computer readable storage device having stored thereon instructions, when executed by one or more processors result in the following operations comprising:
define, via section-defining circuitry, a plurality of LBA sections of memory device circuitry, each defined LBA section including multiple LBAs and having a unique indirection-unit (IU) granularity that defines a physical region size of the memory device circuitry associated with the defined LBA section;
generate, via the section-defining circuitry, a plurality of logical-to-physical (L2P) tables to map a plurality of LBAs to corresponding physical locations of the memory device, each L2P table corresponding to one of the plurality of defined LBA sections; and
notify, via section-notification circuitry, an operating system of the defined plurality of LBA sections to enable the operating system to issue a data access command indicating an LBA based at least in part on the unique IU granularity of a defined LBA section that includes the indicated LBA.

13. The non-transitory computer readable storage device of claim 12, wherein the instructions, when executed by the one or more processors, further result in the following operations comprising to:
determine an IU index number based on an LBA; wherein each L2P table includes multiple IU index numbers corresponding to a group of LBAs; and wherein each IU index number indicates a physical region of the memory device having a region size of the IU granularity associated with the corresponding LBA section.

14. The non-transitory computer readable storage device of claim 13, wherein the instructions, when executed by one or more processors, further result in the following operations comprising to:
divide an IU granularity by an LBA sector size to determine a number of LBA sectors in the IU granularity, and divide the LBA by the by the number of LBA sectors in the IU granularity; wherein a whole number result is the IU index number and any remainder is an offset where each integer of the offset represent an LBA sector size.

15. The non-transitory computer readable storage device of claim 12, wherein the plurality of LBA sections include a first LBA section having a first IU granularity size based on a first group of data sizes associated with the file system, and a second LBA section having a second IU granularity size based on a second group of data sizes associated with the files system; wherein the first IU granularity size is smaller than the second IU granularity size.

16. The non-transitory computer readable storage device of claim 12, wherein an LBA is issued by the operating system and the LBA is a fixed sector size.

17. A multiple indirection unit storage system, comprising:
memory device circuitry; and
a memory controller comprising:
logical block address (LBA) section-defining circuitry to:
define a plurality of LBA sections of the memory device circuitry, each defined LBA section including multiple LBAs and having a unique indirection-unit (IU) granularity that defines a physical region size of the memory device circuitry that is associated with the defined LBA section; and
generate a plurality of logical-to-physical (L2P) tables to map a plurality of LBAs to physical locations of the memory device circuitry, each L2P table corresponding to one of the plurality of defined LBA sections; and
LBA section-notification circuitry to notify a file system of the defined plurality of LBA sections to enable the file system to issue a data access command indicating an LBA based at least in part on the unique IU granularity of a defined LBA section that includes the indicated LBA.

18. The storage system of claim 17, the memory controller further comprising LBA to IU logic to determine an IU index number based on the LBA; wherein each L2P table includes multiple IU index numbers corresponding to a group of LBAs; and wherein each IU index number points to a physical region of the memory device circuitry having a region size of the IU granularity associated with the corresponding LBA section.

19. The storage system of claim 18, wherein the LBA to IU logic is further to determine an IU index number by dividing an IU granularity by an LBA sector size to determine a number of LBA sectors in the IU granularity, and dividing the LBA by the by the number of LBA sectors in the IU granularity; wherein a whole number result is the IU index number and any remainder is an offset where each integer of the offset represent an LBA sector size.

20. The storage system of claim 17, wherein the plurality of LBA sections include a first LBA section having a first IU granularity size based on a first group of data sizes associated with the file system, and a second LBA section having a second IU granularity size based on a second group of data sizes associated with the files system; wherein the first IU granularity size is smaller than the second IU granularity size.

21. The storage system of claim 17, further comprising memory circuitry, associated with the memory device circuitry and memory controller, the memory circuitry to store the plurality of L2P tables.

* * * * *